(12) United States Patent
Bae et al.

(10) Patent No.: US 10,739,901 B2
(45) Date of Patent: Aug. 11, 2020

(54) TOUCH SENSOR AND DISPLAY DEVICE INCLUDING THE SAME

(71) Applicant: Samsung Display Co., Ltd., Yongin-si (KR)

(72) Inventors: Joo Han Bae, Yongin-si (KR); Chang Min Park, Yongin-si (KR); Jin Seok Jang, Yongin-si (KR); Jae Won Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 108 days.

(21) Appl. No.: 15/798,196

(22) Filed: Oct. 30, 2017

(65) Prior Publication Data

US 2018/0129341 A1 May 10, 2018

(30) Foreign Application Priority Data

Nov. 4, 2016 (KR) ........................ 10-2016-0147005

(51) Int. Cl.
| | |
|---|---|
| *G06F 3/045* | (2006.01) |
| *G06F 3/041* | (2006.01) |
| *G06F 3/044* | (2006.01) |
| *H05K 5/00* | (2006.01) |
| *H01L 27/32* | (2006.01) |

(52) U.S. Cl.
CPC ............ *G06F 3/0416* (2013.01); *G06F 3/044* (2013.01); *H05K 5/0017* (2013.01); *G06F 2203/04102* (2013.01); *H01L 27/323* (2013.01)

(58) Field of Classification Search
CPC ....... G06F 3/0412; G06F 3/044; G06F 3/0416
See application file for complete search history.

(56) References Cited

U.S. PATENT DOCUMENTS

| | | | |
|---|---|---|---|
| 8,629,842 B2 | 1/2014 | Jang | |
| 9,513,749 B2 | 12/2016 | Suzuki et al. | |
| 2009/0058825 A1* | 3/2009 | Choi | G06F 3/0412 345/173 |
| 2014/0139447 A1* | 5/2014 | Kang | G06F 3/044 345/173 |
| 2016/0026381 A1* | 1/2016 | Kim | G06F 3/04817 715/761 |
| 2017/0024597 A1 | 1/2017 | Cho et al. | |
| 2018/0004322 A1* | 1/2018 | Nakanishi | G02F 1/133385 |
| 2018/0150153 A1* | 5/2018 | Yoon | G06F 3/041 |

FOREIGN PATENT DOCUMENTS

| | | |
|---|---|---|
| KR | 10-1084169 | 11/2011 |
| KR | 10-1630500 | 6/2016 |
| KR | 10-2016-0096390 | 8/2016 |

* cited by examiner

*Primary Examiner* — Nan-Ying Yang
(74) *Attorney, Agent, or Firm* — H.C. Park & Associates, PLC

(57) ABSTRACT

A display device includes: a display panel including a first surface on which an image is displayed and a second surface opposing the first surface, and a touch sensor, wherein the touch sensor includes a plurality of driving electrodes, a plurality of sensing electrodes disposed to intersect the plurality of driving electrodes, and a touch controller supplying driving signals to the plurality of driving electrodes, wherein, as the display panel is folded or curved, the touch controller sequentially supplies driving signals to the plurality of driving electrodes or simultaneously supplies the driving signals to at least two driving electrodes among the plurality of driving electrodes.

17 Claims, 12 Drawing Sheets

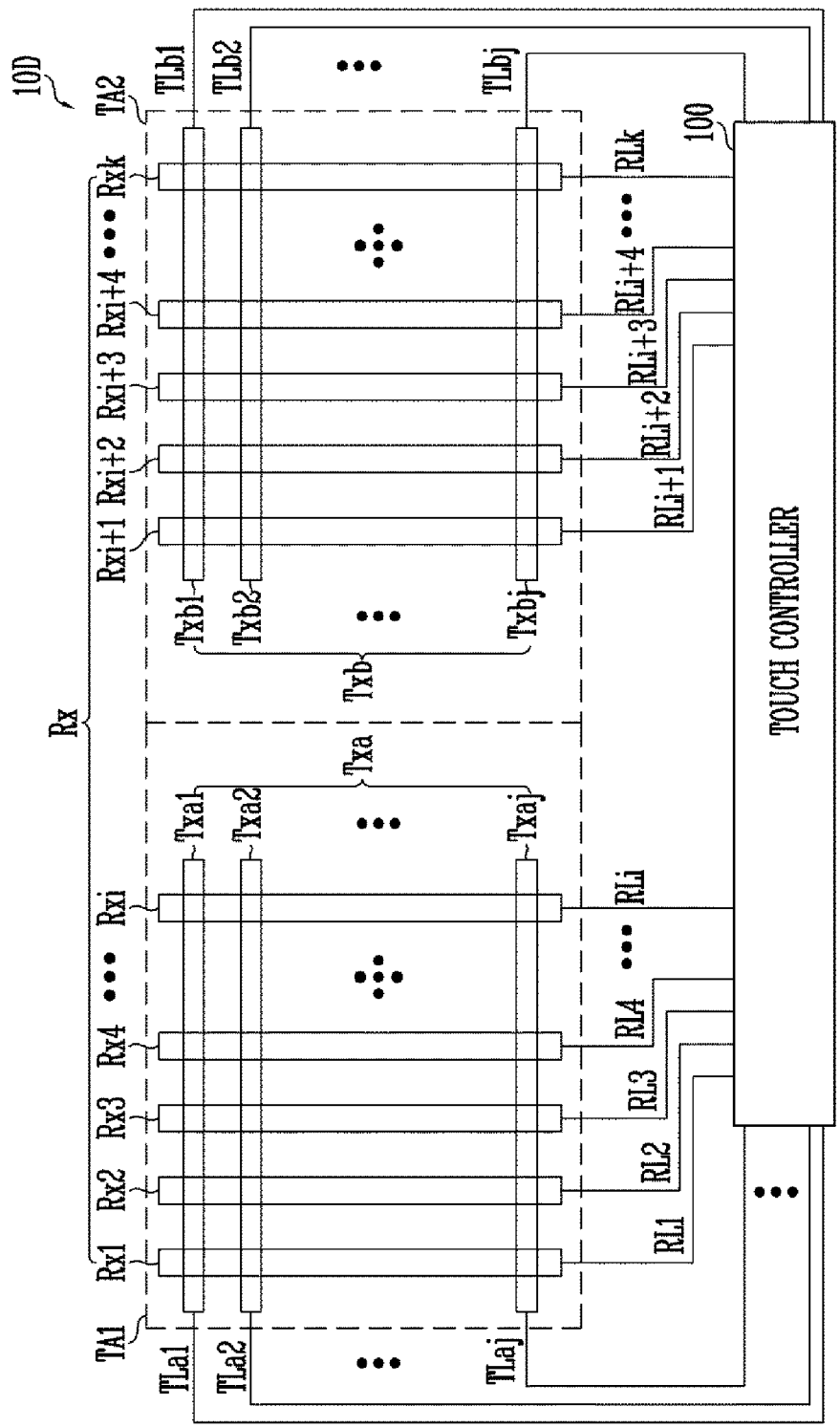

TOUCH SENSOR AND DISPLAY DEVICE INCLUDING THE SAME

CROSS REFERENCE TO RELATED APPLICATION

This application claims priority from and the benefit of Korean Patent Application No. 10-2016-0147005 filed on Nov. 4, 2016, which is hereby incorporated by reference for all purposes as if fully set forth herein.

BACKGROUND

Field

Exemplary embodiments relate to a touch sensor and a display device including the same.

Discussion of the Background

As interest in information displays and demand for portable information media increase, research and commercialization has centered on display devices.

Recent display devices include touch sensors for receiving touch inputs of users in addition to image display functions. Accordingly, the users can more conveniently use the display devices through the touch sensors.

Various types of touch sensors are used. However, among these touch sensors, a capacitive touch sensor senses a point at which capacitance is changed as a user's hand or object is in contact therewith, thereby detecting a touch position. Since the capacitive touch sensor easily senses a multi-touch and has excellent accuracy, the capacitive touch sensor has recently been widely used.

The above information disclosed in this Background section is only for enhancement of understanding of the background of the inventive concepts. Therefore, it may contain information that does not form the prior art that was already known to a person of ordinary skill in the art or was publically available prior to an effective filing date of subject matter disclosed herein.

SUMMARY

Exemplary embodiments provide a touch sensor and a display device including the same, which can rapidly and efficiently detect a touch position even when the display device has a large-area display region.

An exemplary embodiment discloses a display device including: a display panel including a first surface on which an image is displayed and a second surface opposing the first surface; and a touch sensor, wherein the touch sensor includes: a plurality of driving electrodes; a plurality of sensing electrodes disposed to intersect the driving electrodes; and a touch controller supplying driving signals to the plurality of driving electrodes, wherein, as the display panel is folded or curved, the touch controller sequentially supplies driving signals to the plurality of driving electrodes or simultaneously supplies the driving signals to at least two driving electrodes among the plurality of driving electrodes.

The first surface may include a first region and a second region adjacent to the first region. When the display device is folded or curved in a direction in which the first region and the second region face each other, the touch controller may simultaneously supply the driving signals to at least two adjacent driving electrodes among the plurality of driving electrodes corresponding to the first region.

The touch controller may sequentially supply the driving signals to the plurality of driving electrodes corresponding to the second region.

The first surface may include a first region and a second region adjacent to the first region. When the display device is folded or curved in a direction in which the first region and the second region face each other, the touch controller may supply the driving signals only to the driving electrodes corresponding to either one of the first region or the second region.

When the display device is folded or curved in a direction in which a portion of the second surface faces the other portion of the second surface, the touch controller may simultaneously supply the driving signals to at least two adjacent driving electrodes among the plurality of driving electrodes corresponding to the portion of the second surface.

The touch controller may sequentially supply the driving signals to the plurality of driving electrodes corresponding to the other portion of the second surface.

When the display device is folded or curved in a direction in which a portion of the second surface faces the other portion of the second surface, the touch controller may supply the driving signals only to the driving electrodes corresponding to either one of the portion of the second surface or the other portion of the second surface.

An exemplary embodiment also discloses a display device including: a display panel including a first surface on which an image is displayed and a second surface opposing the first surface; and a touch sensor, wherein the touch sensor includes: a plurality of driving electrodes; a plurality of sensing electrodes disposed to intersect the plurality of driving electrodes, wherein the plurality of sensing electrodes includes preset reference sensing electrodes; and a touch controller detecting a touch position, using sensing signals received from the plurality of sensing electrodes, wherein, as the display panel is folded or curved, the touch controller detects the touch position, using sensing signals sequentially received from the plurality of sensing electrodes, or detects the touch position, using sensing signals received from preset reference sensing electrodes.

The first surface may include a first region and a second region adjacent to the first region. When the display device is folded or curved in a direction in which the first region and the second region face each other, the touch controller may detect the touch position, using sensing signals received from the preset reference sensing electrodes corresponding to the first region.

The touch controller may detect the touch position, using sensing signals sequentially received from sensing electrodes corresponding to the second region among the plurality of sensing electrodes.

The first surface may include a first region and a second region adjacent to the first region. When the display device is folded or curved in a direction in which the first region and the second region face each other, the touch controller may detect the touch position, using only sensing signals received from sensing electrodes corresponding to either one of the first region or the second region.

When the display device is folded or curved in a direction in which a portion of the second surface faces the other portion of the second surface, the touch controller may detect the touch position, using sensing signals received from the preset reference sensing electrodes corresponding to the portion of the second surface.

The touch controller may detect the touch position, using sensing signals sequentially received from sensing electrodes corresponding to the other portion of the second surface among the plurality of sensing electrodes.

When the display device is folded or curved in a direction in which a portion of the second surface faces the other portion of the second surface, the touch controller may detect the touch position, using only the sensing signals received from sensing electrodes corresponding to either one of the portion of the second surface or the other portion of the second surface.

An exemplary embodiment also discloses a touch sensor including: a plurality of driving electrodes; a plurality of sensing electrodes disposed to intersect the plurality of driving electrodes; and a touch controller, as the plurality of driving electrodes or the plurality of sensing electrodes are curved, sequentially supplying driving signals to the plurality of driving electrodes or simultaneously supplying driving signals to at least two adjacent driving electrodes among the plurality of driving electrodes.

As the plurality of driving electrodes or the plurality of sensing electrodes are curved, the touch controller may detect a touch position, using sensing signals sequentially received from the plurality of sensing electrodes, or detect the touch position, using sensing signals received from preset reference sensing electrodes among the plurality of sensing electrodes.

The number of the plurality of driving electrodes may be greater than that of the plurality of sensing electrodes.

The number of the plurality of sensing electrodes may be greater than that of the plurality of driving electrodes.

It is to be understood that both the foregoing general description and the following detailed description are exemplary and explanatory and are intended to provide further explanation of the exemplary embodiments as claimed.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

The accompanying drawings, which are included to provide a further understanding of the exemplary embodiments and are incorporated in and constitute a part of this specification, illustrate exemplary embodiments, and together with the description serve to explain the principles of the exemplary embodiments.

Figure 1:
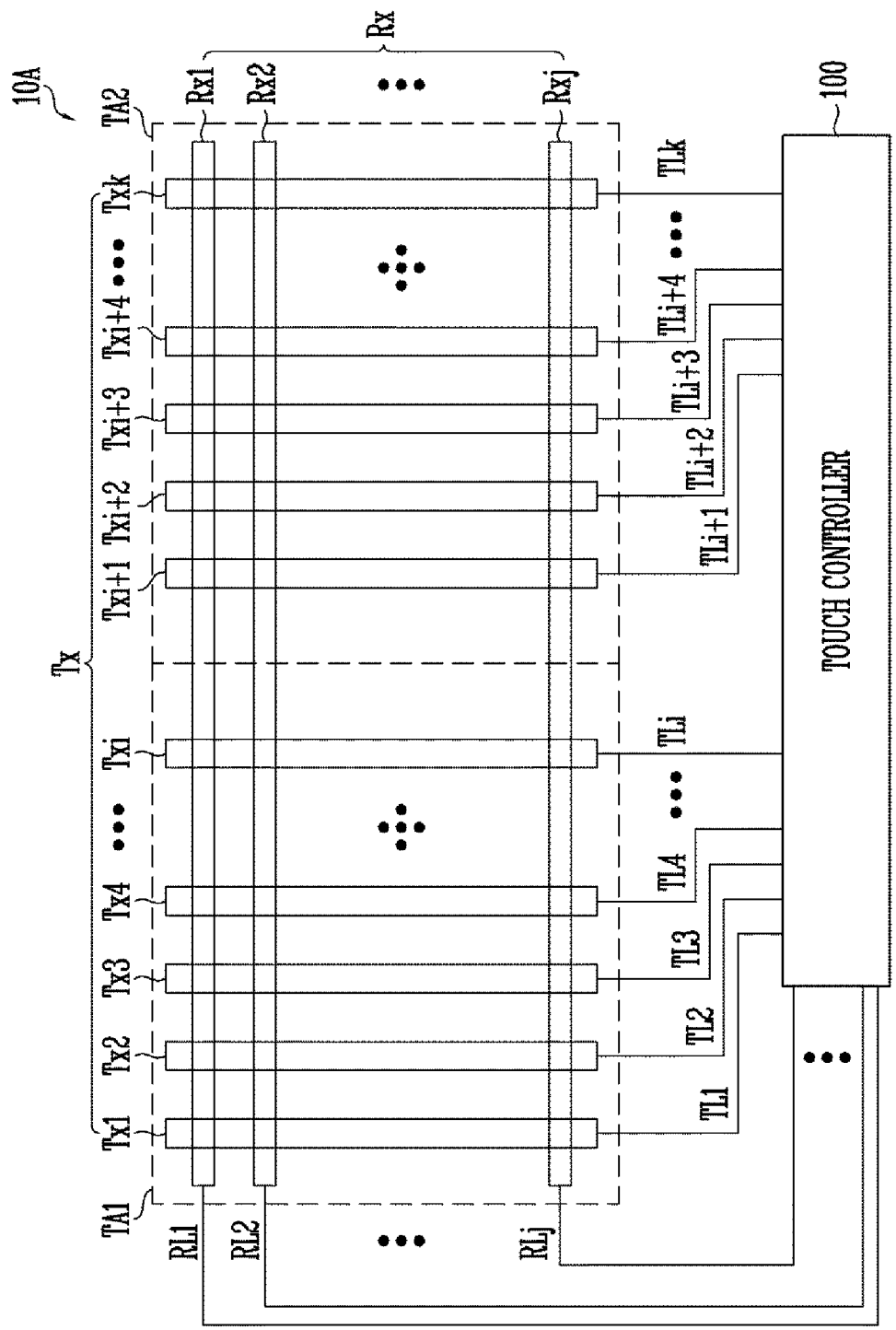

FIG. 1 is a view illustrating a touch sensor according to an exemplary embodiment.

Figure 2:
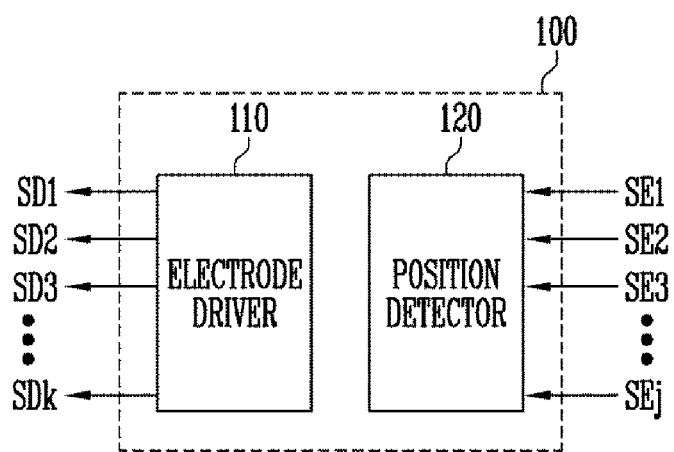

FIG. 2 is a view illustrating a touch controller shown in FIG. 1.

Figure 3:
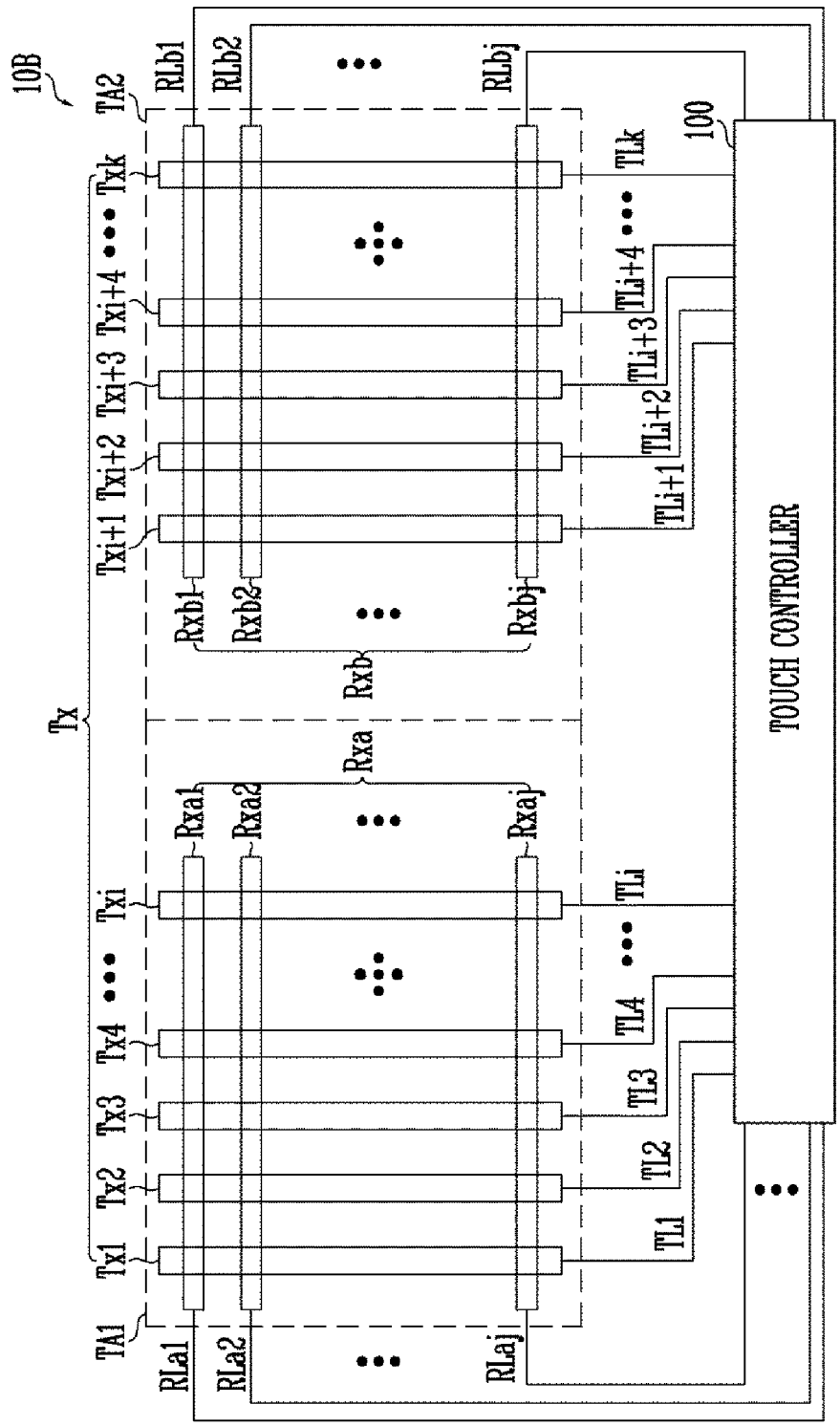

FIG. 3 is a view illustrating a touch sensor according to an exemplary embodiment.

Figure 4:
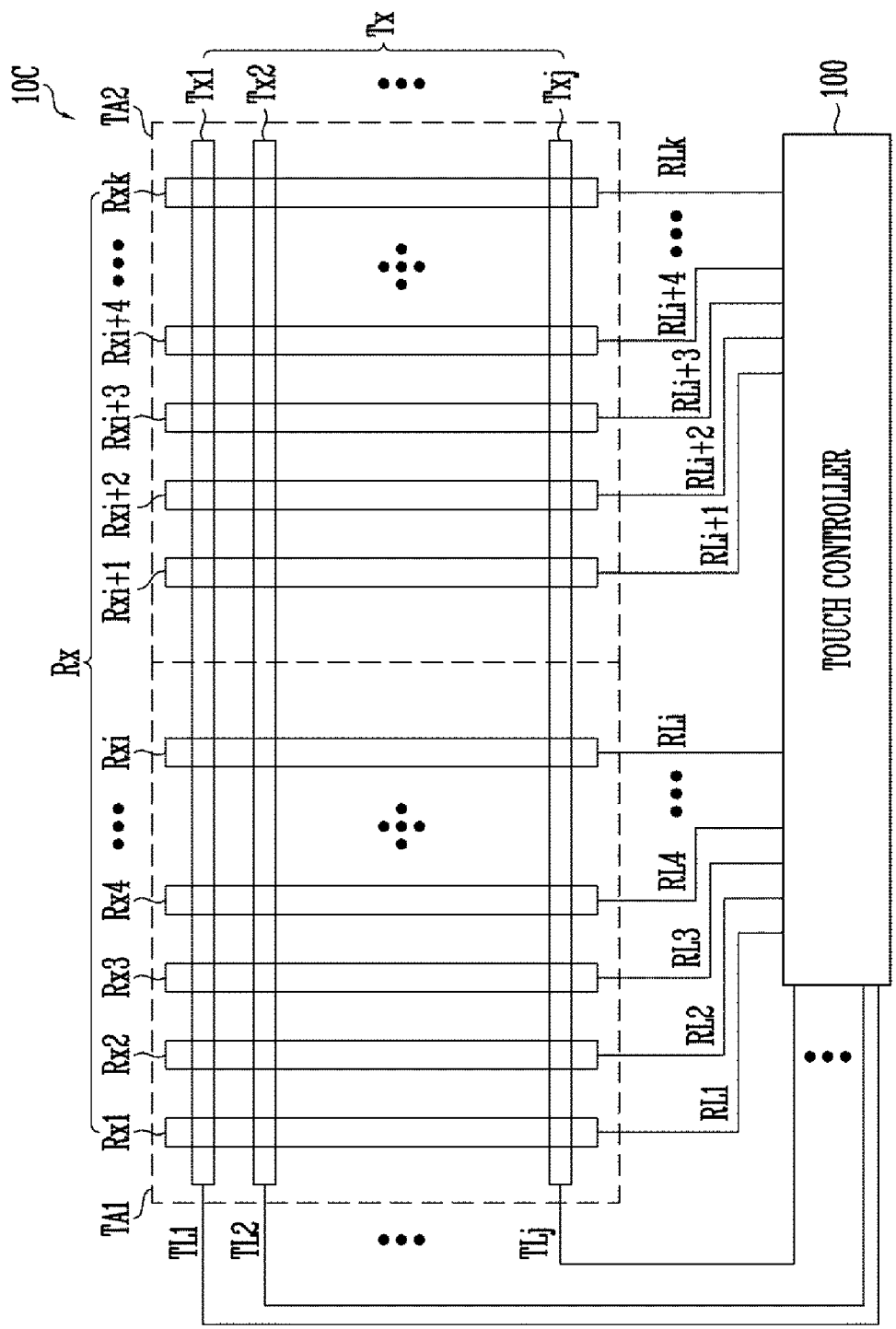

FIG. 4 is a view illustrating a touch sensor according to an exemplary embodiment.

FIG. 5 is a view illustrating a touch sensor according to an exemplary embodiment.

Figure 6A:
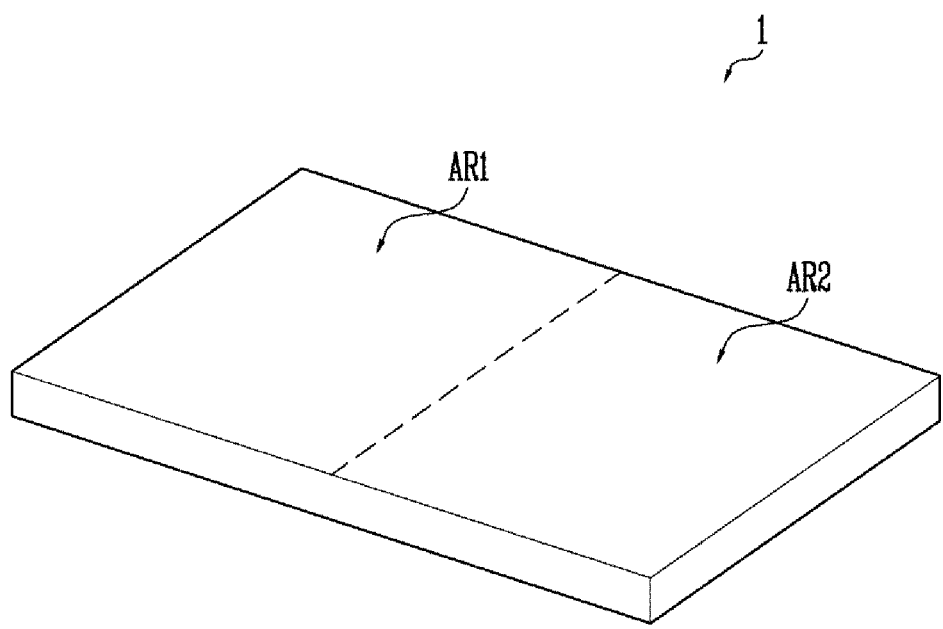
Figure 6B:
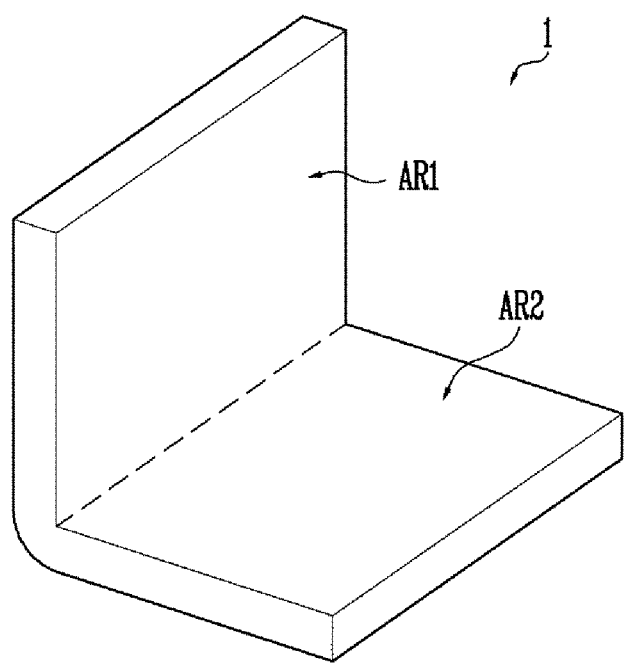

FIGS. 6A and 6B are views illustrating a touch sensing method of a display device according to an exemplary embodiment.

Figure 7A:
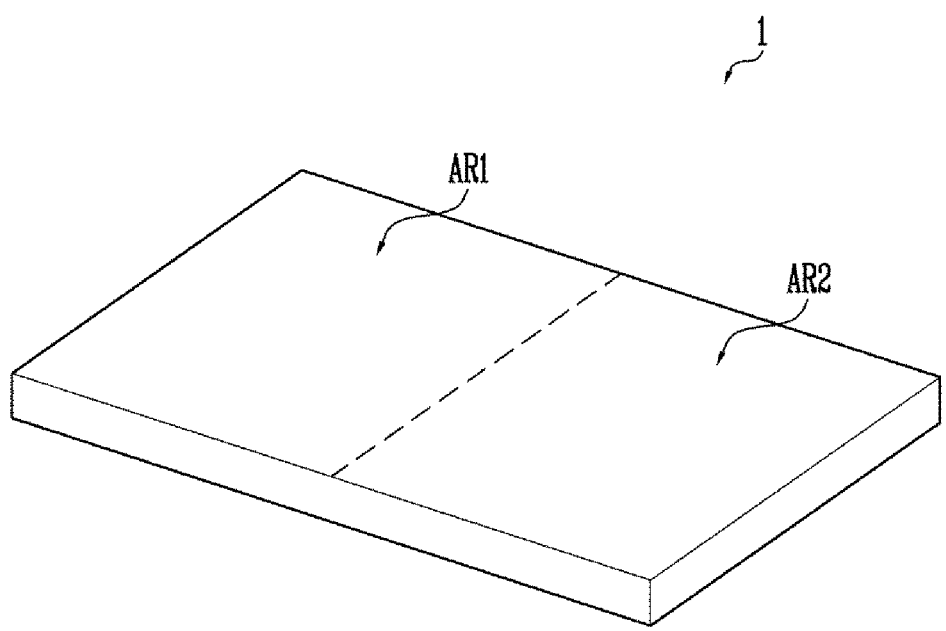
Figure 7B:
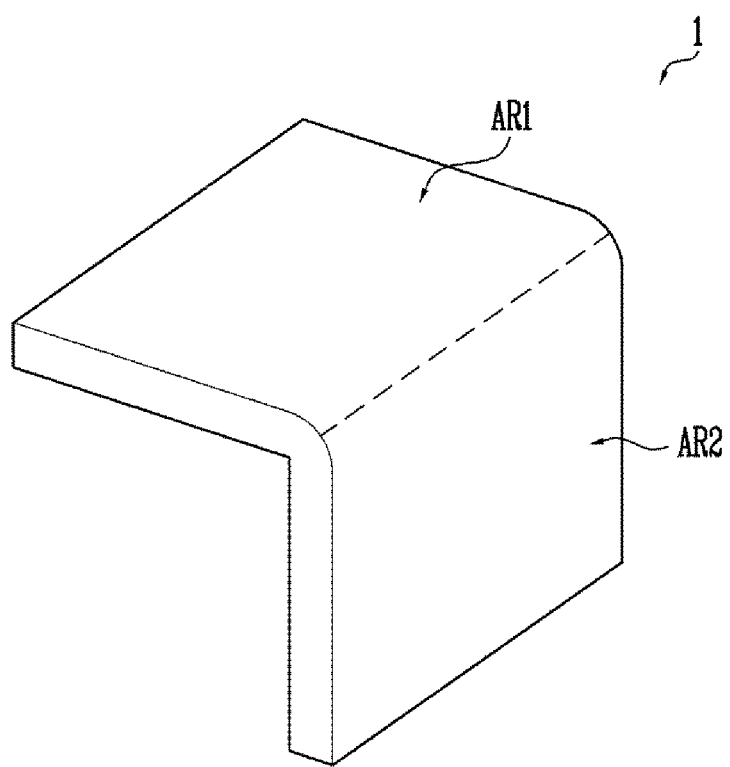
Figure 7C:
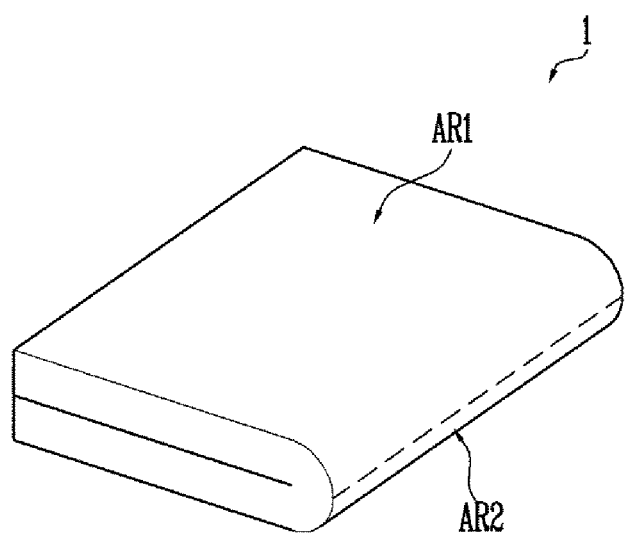

FIGS. 7A, 7B, and 7C are views illustrating a touch sensing method of a display device according to another exemplary embodiment.

Figure 8:
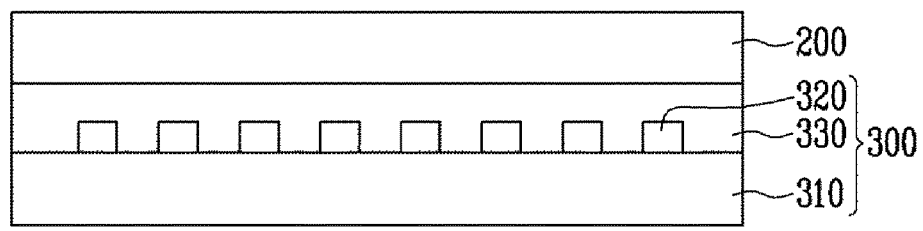

FIG. 8 is a view illustrating a sensor unit and a display panel according to an exemplary embodiment.

Figure 9:
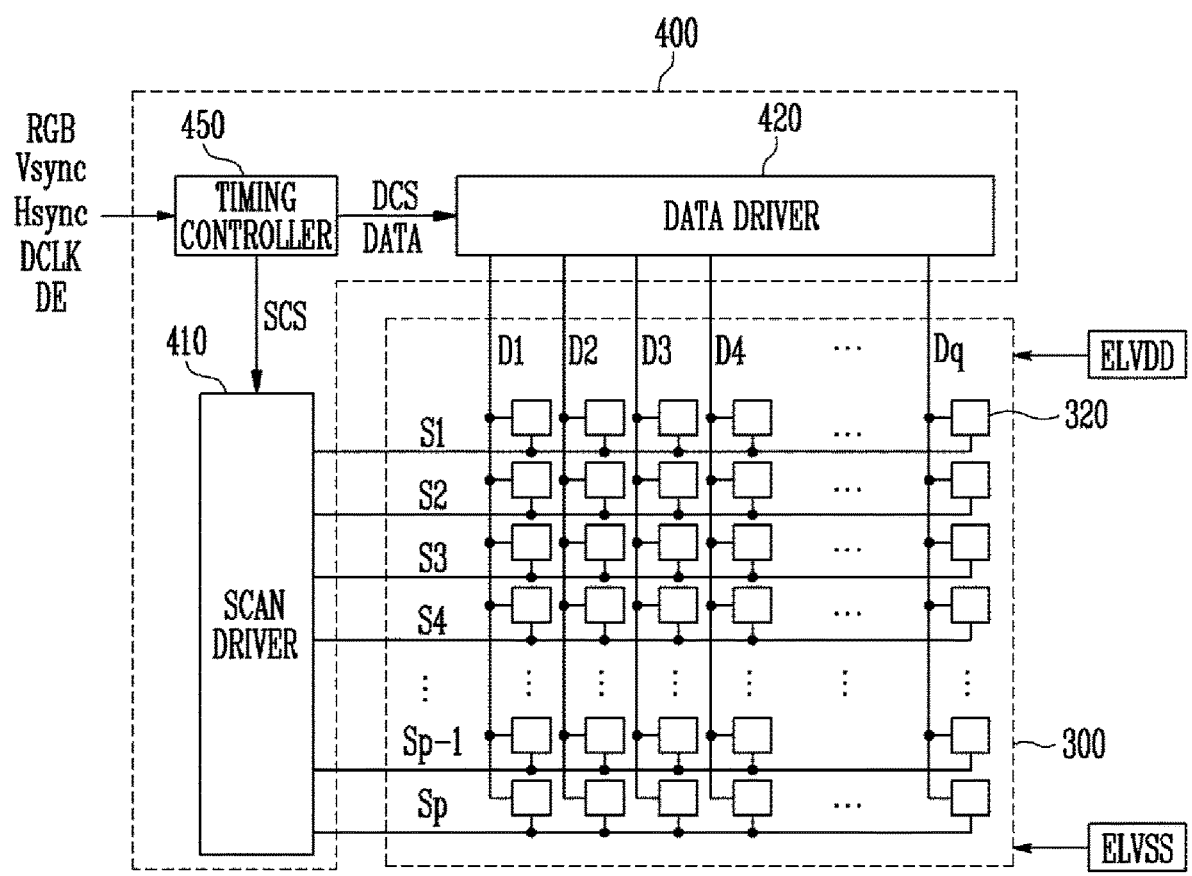

FIG. 9 is a view illustrating a display driving unit and pixels according to an exemplary embodiment.

Figure 10:
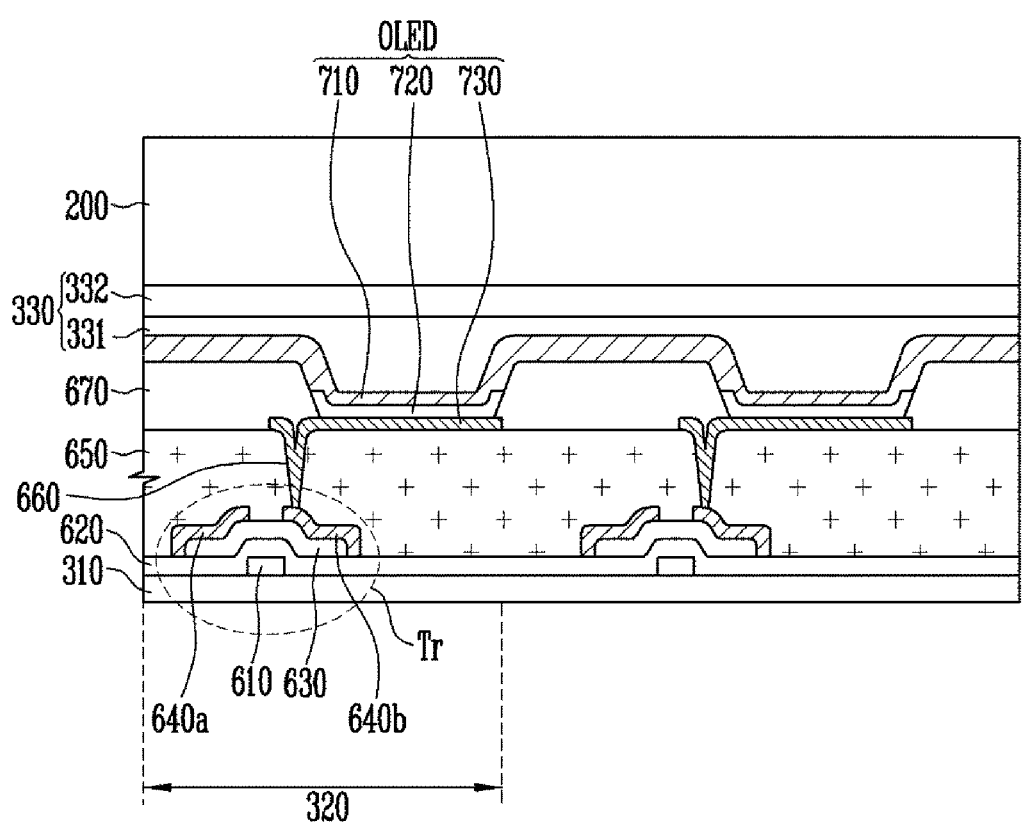

FIG. 10 is a sectional view of a display panel according to an exemplary embodiment.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the exemplary embodiments.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a view illustrating a touch sensor according to an exemplary embodiment.

Referring to FIG. 1, the touch sensor 10A according to the exemplary embodiment may include a plurality of driving electrodes Tx, a plurality of sensing electrodes Rx, and a touch controller 100.

The driving electrodes Tx and the sensing electrodes Rx may be disposed in first and second touch sensing regions TA1 and TA2. The first and second sensing regions TA1 and TA2 may be defined as regions in which a touch input by a user can be sensed.

The driving electrodes Tx may be formed to extend in a first direction (e.g., a y-axis direction), and be arranged in plural numbers along a second direction (e.g., an x-axis direction) intersecting the first direction.

For example, the driving electrodes Tx may include first to kth driving electrodes Tx1 to Txk which are formed to extend in the first direction, and the first to kth driving electrodes Tx1 to Txk may be arranged along the second direction.

In addition, the sensing electrode Rx may be formed to extend in the second direction, and be arranged in plural numbers along the first direction.

For example, the sensing electrodes Rx may include first to jth sensing electrodes Rx1 to Rxj which are formed to extend in the second direction, and the first to jth sensing electrodes Rx1 to Rxj may be arranged along the first direction.

As described above, the sensing electrode Rx may be disposed to intersect the driving electrodes Tx, and a mutual capacitance may be formed between the driving electrodes Tx and the sensing electrodes Rx. When a touch of the user is input to the touch sensor 10A, the mutual capacitance may be changed corresponding to the touch.

The driving electrodes Tx and the sensing electrodes Rx may include a conductive material. For example, each of the driving electrodes Tx and the sensing electrodes Rx may include at least one of gold (Au), silver (Ag), aluminum (Al), molybdenum (Mo), chromium (Cr), titanium (Ti), nickel (Ni), neodymium (Nd), copper (Cu), platinum (Pt), and any alloy thereof.

In addition, the driving electrodes Tx and the sensing electrodes Rx may be made of a transparent conductive material. For example, each of the driving electrodes Tx and the sensing electrodes Rx may include at least one of silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nano tube, graphene, and the like. Also, each of the driving electrodes Tx and the sensing electrodes Rx may be formed in a single- or multi-layered structure.

The driving electrodes Tx and the sensing electrodes Rx may be made of the same material, or be made of different materials.

Meanwhile, the driving electrodes Tx and the sensing electrodes Rx may be located in different layers.

In addition, the driving electrodes Tx and the sensing electrodes Rx may be located in the same layer. However, in this case, an insulating layer may be partially located at intersection portions of the driving electrodes Tx and the sensing electrodes Rx so as to prevent electrical connection between the driving electrodes Tx and the sensing electrodes Rx.

In some embodiments, a number of the driving electrodes Tx may be greater than that of the sensing electrodes Rx.

Meanwhile, in FIG. 1, the shape of each of the driving electrodes Tx and the sensing electrode Rx is formed in an approximately bar shape. However, the shape of each of the driving electrodes Tx and the sensing electrode Rx may be variously changed.

The touch controller 100 may detect a touch position.

In order to drive the touch sensor 10A, the touch controller 100 may supply a driving signal to the first to kth driving electrodes Tx1 to Txk through first to kth driving lines TL1 to TLk.

In some embodiments, the touch controller 100 may simultaneously supply a driving signal to at least two adjacent driving electrodes among the first to kth driving electrodes Tx1 to Txk.

For example, the touch controller 100 may simultaneously supply the driving signal to the first and second driving electrodes Tx1 and Tx2 through the first and second driving lines TL1 and TL2, and simultaneously supply to the third and fourth driving electrodes Tx3 and Tx4 through the third and fourth driving lines TL3 and TL4. The touch controller 100 may supply the driving signal to the other driving electrodes in the same manner.

In other embodiments, the touch controller 100 may differently control driving of the driving electrodes included in the first touch sensing region TA1 and driving of the driving electrodes included in the second touch sensing region TA2.

For example, the touch controller 100 may sequentially supply the driving signal to first to ith driving electrodes Tx1 to Txi included in the first touch sensing region TA1. On the other hand, the touch controller 100 may simultaneously supply the driving signal to two adjacent driving electrodes among (i+1)th to kth driving electrodes Txi+1 to Txk included in the second touch sensing region TA2. That is, the touch controller 100 may simultaneously supply the driving signal to the (i+1)th and (i+2)th driving electrodes Txi+1 and Txi+2, and simultaneously supply the driving signal to the (i+3)th and (i+4)th driving electrodes Txi+3 and Txi+4.

In still other embodiments, the touch controller 100 may supply the driving signal to only the driving electrodes disposed in any one of the first and second touch sensing regions TA1 and TA2.

For example, the touch controller 100 may supply the driving signal to only one of the first to ith driving electrodes Tx1 to Txi and the (i+1)th to kth driving electrodes Txi+1 to Txk.

The touch controller 100 may detect a touch position, using sensing signals received from first to jth sensing electrodes Rx1 to Rxj through first to jth sensing lines RL1 to RLj. That is, the touch controller 100 may detect a variation of capacitance, caused by a touch, using the sensing signals, and detect a touch position through the detected variation of capacitance.

In addition, as the driving electrodes or the sensing electrodes are curved, the touch controller 100 may sequentially supply the driving signal to the first to kth driving electrodes Tx1 to Txk, or simultaneously supply the driving signal to at least two electrodes among the first to kth driving electrodes Tx1 to Txk.

FIG. 2 is a view illustrating the touch controller shown in FIG. 1.

Referring to FIG. 2, the touch controller 100 according to the embodiment may include an electrode driver 110 and a position detector 120.

The electrode driver 110 may supply first to kth driving signals SD1 to SDk to the first to kth driving electrodes Tx1 to Txk through the driving lines TL1 to TLk.

In some embodiments, the electrode driver 110 may supply driving signals to at least two adjacent driving electrodes among the first to kth driving electrodes Tx1 to Txk.

For example, the electrode driver 110 may simultaneously supply the first and second driving signals SD1 and SD2 to the first and second driving electrodes Tx1 and Tx2, and simultaneously supply the third and fourth driving signals SD3 and SD4 to the third and fourth driving electrodes Tx3 and Tx4. Driving signals may be supplied to the other driving electrodes in the same manner.

For example, the electrode driver 110 may simultaneously supply the same driving signal to the first and second driving electrodes Tx1 and Tx2, and simultaneously supply another driving signal to the third and fourth driving electrodes Tx3 and Tx4. Driving signals may be supplied to the other driving electrodes in the same manner.

In other embodiments, the electrode driver 110 may supply different driving signals to the driving electrodes included in each of the first and second touch sensing regions TA1 and TA2.

For example, the electrode driver 110 may sequentially supply first to ith driving signals SD1 to SDi to the first to ith driving electrodes Tx1 to Txi included in the first touch sensing region TA1. On the other hand, the electrode driver 110 may simultaneously supply driving signals to two adjacent driving electrodes among the (i+1)th to kth driving electrodes Txi+1 to Txk included in the second touch sensing region TA2.

In still other embodiments, the electrode driver 110 may supply driving signals to only the driving electrodes disposed in any one of the first and second touch sensing regions TA1 and TA2.

For example, the electrode driver 110 may supply driving signals to only one of the first to ith driving electrodes Tx1 to Txi and the (i+1)th to kth driving electrodes Txi+1 to Txk.

For example, the electrode driver 110 may supply the first to ith driving signals SD1 to SDi to the first to ith driving electrodes Tx1 to Txi, and supply no driving signal to the (i+1)th to kth driving electrodes Txi+1 to Txk.

The position detector 120 may receive first to jth sensing signals SE1 to SEj from the first to jth sensing electrodes Rx1 to Rxj through the sensing lines RL1 to RLj, and detect a touch position on the first and second touch sensing regions TA1 to TA2, using the first to jth sensing signals SE1 to SEj.

As described above, the touch sensor 10A according to the exemplary embodiment supplies driving signals to only some driving electrodes among the plurality of driving electrodes Tx or simultaneously supplies driving signals to at least two driving electrodes, thereby decreasing the number of channels required to supply driving signals.

Thus, according to the touch sensor 10A according to the exemplary embodiment, the number of channels can be decreased even when the display area of a display device is increased, and hence a touch position can be efficiently detected.

FIG. 3 is a view illustrating a touch sensor according to an exemplary embodiment.

In the touch sensor 10B shown in FIG. 3, differences from the touch sensor 10A shown in FIG. 1 will be mainly described to avoid redundancy. Portions not particularly described in FIG. 3 follow those of the touch sensor 10A according to the above-described embodiment. In addition, identical reference numerals refer to identical components, and similar reference numerals refer to similar components.

Referring to FIG. 3, driving electrodes Tx and first sensing electrodes Rxa may be disposed in a first touch sensing region TA1, and driving electrodes Tx and second sensing electrode Rxb may be disposed in a second touch sensing region TA2.

The driving electrode Tx may be formed to extend in a first direction (e.g., a y-axis direction), and be arranged in plural numbers along a second direction (e.g., an x-axis direction) intersecting the first direction.

In addition, each of the first and second sensing electrodes Rxa and Rxb may be formed to extend in the second direction, and be arranged in plural numbers along the first direction.

For example, the first sensing electrodes Rxa may include first to jth sensing electrodes Rxa1 to Rxaj which are formed to extend in the second direction, and the second sensing electrodes Rxb may include first to jth sensing electrodes Rxb1 to Rxbj which are formed to extend in the second direction.

A touch controller 100 may receive sensing signals from the first sensing electrodes Rxa through first to jth sensing lines RLa1 to RLaj, and receive sensing signals from the second sensing electrodes Rxb through first to jth sensing lines RLb1 to RLbj. The touch controller 100 may detect a touch position, using the sensing signals received from the first sensing electrodes Rxa and the second sensing electrode Rxb.

FIG. 4 is a view illustrating a touch sensor according to an exemplary embodiment.

In the touch sensor 10C shown in FIG. 4, differences from the touch sensor 10A shown in FIG. 1 will be mainly described to avoid redundancy. Portions not particularly described in FIG. 4 follow those of the touch sensor 10A according to the above-described embodiment. In addition, identical reference numerals refer to identical components, and similar reference numerals refer to similar components.

Referring to FIG. 4, the touch sensor 10C according to the exemplary embodiment may include a plurality of driving electrodes Tx, a plurality of sensing electrodes Rx, and a touch controller 100.

The driving electrodes Tx and the sensing electrodes Rx may be disposed in first and second touch sensing regions TA1 and TA2.

The driving electrode Tx may be formed to extend in a second direction (e.g., an x-axis direction), and be arranged in plural numbers along a first direction (e.g., a y-axis direction) intersecting the first direction.

For example, the driving electrodes Tx may include first to jth driving electrodes Tx1 to Txj which are formed to extend in the second direction, and the first to jth driving electrodes Tx1 to Txj may be arranged along the first direction.

In addition, the sensing electrode Rx may be formed to extend in the first direction, and be arranged in plural numbers along the second direction.

For example, the sensing electrodes Rx may include first to kth sensing electrodes Rx1 to Rxk which are formed to extend in the first direction, and the first to kth sensing electrodes Rx1 to Rxk may be arranged along the second direction.

In some embodiments, a number of the sensing electrodes Rx may be greater than that of the driving electrodes Tx.

The touch controller 100 may detect a touch position.

In order to drive the touch sensor 10C, the touch controller 100 may supply driving signals to the first to jth driving electrode Tx1 to Txj through first to jth driving lines TL1 to TLj.

The touch controller 100 may detect a touch position, using sensing signals received from the first to kth sensing electrodes Rx1 to Rxk through first to kth sensing lines RL1 to RLk.

In some embodiments, the touch controller 100 may detect a touch position, using sensing signals received from preset reference sensing electrodes among the first to kth sensing electrodes Rx1 to Rxk.

For example, the touch controller 100 may set, as reference sensing electrodes, odd-numbered sensing electrodes Rx1, Rxi, . . . or even-numbered sensing electrodes Rx2, Rx4, . . . among the first to kth sensing electrodes Rx1 to Rxk, and detect a touch position, using only sensing signals received from the reference sensing electrodes.

In other embodiments, the touch controller 100 may detect a touch position in different manners, using sensing signals received from the sensing electrodes respectively included in the first touch sensing region TA1 and the second touch sensing region TA2.

For example, the touch controller 100 may detect a touch position on the first touch sensing region TA1, using sensing signals received from reference sensing electrodes among first to ith sensing electrodes Rx1 to Rxi included in the first touch sensing region TA1. On the other hand, the touch controller 100 may detect a touch position on the second touch sensing region TA2, using sensing signals sequentially received from (i+1)th to kth sensing electrodes Rxi+1 to Rxk included in the second touch sensing region TA2.

In still other embodiments, the touch controller 100 may detect a touch position, using only sensing signals received from the sensing electrodes included in any one of the first touch sensing region TA1 and the second touch sensing region TA2.

For example, the touch controller 100 may detect only a touch position on the first touch sensing region TA1, using sensing signals received from the first to ith sensing electrodes Rx1 to Rxi included in the first touch sensing region TA1, or detect only a touch position on the second touch sensing region TA2, using sensing signals received from the (i+1)th to kth sensing electrodes Rxi+1 to Rxk included in the second touch sensing region TA2.

In addition, as the driving electrodes or the sensing electrodes are curved, the touch controller 100 may detect a touch position, using sensing signals sequentially received from the first to kth sensing electrodes Rx1 to Rxk, or detect a touch position, using sensing signals received from the preset reference sensing electrodes among the first to kth sensing electrodes Rx1 to Rxk.

As described above, the touch sensor 10C according to an exemplary embodiment detects a touch position, using sensing signals received from some sensing electrodes among the plurality of sensing electrodes, or detects only a touch position on a specific touch sensing region, so that it is possible to reduce a calculation time required to detect a touch position. Thus, the touch sensor 10C according to the exemplary embodiment can detect a touch position at fast speed.

FIG. 5 is a view illustrating a touch sensor according to an exemplary embodiment.

In the touch sensor 10D shown in FIG. 5, differences from the touch sensor 10C shown in FIG. 4 will be mainly described to avoid redundancy. Portions not particularly described in FIG. 5 follow those of the touch sensor 10C according to the above-described embodiment. In addition, identical reference numerals refer to identical components, and similar reference numerals refer to similar components.

Referring to FIG. 5, first driving electrodes Txa and sensing electrodes Rx may be disposed in a first touch sensing region TA1, and second driving electrodes Txb and sensing electrodes Rx may be disposed in a second touch sensing region TA2.

Each of the first and second driving electrodes Txa and Txb may be formed to extend in a second direction (e.g., an x-axis direction), and be arranged in plural numbers along a first direction (e.g., a y-axis direction) intersecting the second direction.

For example, the first driving electrodes Txa may include first to jth driving electrodes Txa1 to Txaj which are formed to extend in the second direction, and the second driving electrodes Txb may include first to jth driving electrodes Txb1 to Txbj which are formed to extend in the second direction.

In addition, the sensing electrode Rx may be formed to extend in the second direction, and be arranged in plural numbers along the first direction.

A touch controller 100 may receive sensing signals from the sensing electrode Rx through first to kth sensing lines RL1 to RLk. The touch controller 100 may detect a touch position, using the sensing signals received from the sensing electrodes Rx.

FIGS. 6A and 6B are views illustrating a touch sensing method of a display device according to an exemplary embodiment.

The display device 1 shown in FIGS. 6A and 6B includes a display panel and a touch sensor. In this case, the display device 1 is schematically illustrated for convenience of description.

Referring to FIG. 6A, the display panel of the display device 1 includes a first surface on which an image is displayed and a second surface opposing the first surface. In addition, the first surface includes a first region AR1 and a second region AR2 adjacent to the first region AR1.

When the display device 1 is in a state in which it is not folded or curved, the touch controller 100 may simultaneously supply driving signals to at least two driving electrodes among driving electrodes Tx corresponding to the first region AR1 and the second region AR2.

In some embodiments, the touch controller 100 may detect a touch position, using sensing signals received from preset reference sensing electrodes among sensing electrodes disposed in the first region AR1 and the second region AR2.

Referring to FIG. 6B, when the display device 1 is folded or curved in a direction in which the first region AR1 and the second region AR2 face each other, the touch controller 100 may simultaneously supply driving signals to at least two driving electrodes among the driving electrodes Tx corresponding to the first region AR1. In this case, the touch controller 100 may sequentially supply driving signals to the driving electrodes Tx corresponding to the second region AR2.

In some embodiments, when the display device 1 is folded or curved in the direction in which the first region AR1 and the second region AR2 face each other, the touch controller 100 may supply driving signals to only the driving electrodes Tx corresponding to any one of the first region AR1 and the second region AR2.

In other embodiments, when the display device 1 is folded or curved in the direction in which the first region AR1 and the second region AR2 face each other, the touch controller 100 may detect a touch signal by sequentially receiving sensing signals from sensing electrodes Rx corresponding to any one of the first region AR1 and the second region AR2, and detect a touch signal by receiving sensing signals from reference sensing electrodes corresponding to the other of the first region AR1 and the second region AR2.

FIGS. 7A, 7B, and 7C are views illustrating a touch sensing method of a display device according to another exemplary embodiment.

The display device 1 shown in FIGS. 7A, 7B, and 7C includes a display panel and a touch sensor. In this case, the display device 1 is schematically illustrated for convenience of description.

Referring to FIG. 7A, the display panel of the display device 1 includes a first surface on which an image is displayed and a second surface opposing the first surface. In addition, the first surface includes a first region AR1 and a second region AR2 adjacent to the first region AR2.

When the display device 1 is in a state in which it is not folded or curved, the touch controller 100 may simultaneously supply driving signals to at least two driving electrodes among driving electrodes Tx corresponding to the first region AR1 and the second region AR2.

Referring to FIGS. 7B and 7C, when the display device 1 is folded or curved in a direction in which a portion of the second surface faces the other portion of the second surface, the touch controller 100 may simultaneously supply driving signals to at least two driving electrodes among driving electrodes Tx corresponding to the portion of the second surface. In this case, the touch controller 100 may sequentially supply driving signals to driving electrodes Tx corresponding to the other portion of the second surface.

In some embodiments, when the display device 1 is folded or curved in a direction in which a portion of the second surface faces the other portion of the second surface, the touch controller 100 may supply driving signals to only driving electrodes corresponding to any one of the portion of the second surface and the other portion of the second surface.

In other embodiments, when the display device 1 is folded or curved in a direction in which a portion of the second surface faces the other portion of the second surface, the touch controller 100 may detect a touch signal by sequentially receiving sensing signals from sensing electrodes Rx corresponding to any one of the portion of the second surface and the other portion of the second surface, and detect a touch signal by receiving sensing signals from reference sensing electrodes corresponding to the other one of the first region AR1 and the second region AR2.

FIG. 8 is a view illustrating a sensor unit and a display panel according to an exemplary embodiment.

Referring to FIG. 8, the sensor unit 200 according to the exemplary embodiment is disposed on the display panel 300, and may detect a touch input to the display panel 300.

The display panel 300 may include a substrate 310, pixels 320, and an encapsulation layer 330.

The plurality of pixels 320 may be located on the substrate 310. In addition, the encapsulation layer 330 may be located on the pixels 320 and the substrate 310.

In some embodiments, the substrate 310 may be made of an insulative material such as glass or resin. Also, the substrate 310 may be made of a material having flexibility or elasticity to be bendable or foldable. The substrate 310 may have a single or a multi-layered structure.

For example, the substrate 310 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the exemplary embodiments are not limited thereto, and the material constituting the substrate 310 may be variously changed. For example, the substrate 310 may be made of fiber glass reinforced plastic (FRP), or the like.

The pixels 320 emit light under the control of a display driving unit, and the encapsulation layer 330 may prevent moisture, oxygen, etc. from penetrating into the pixels 320.

In some embodiments, the encapsulation layer 330 may include at least one of glass, an organic material, and an inorganic material, and have a single or multi-layered structure. For example, the encapsulation layer 330 may have a multi-layered structure including at least one organic layer and at least one inorganic layer.

In some embodiments, the material of the organic layer may include organic insulating materials such as polyacryl, polyimide, fluorine-based compound such as Teflon, polyepoxy, and benzocyclobutene. The material of the inorganic layer may include inorganic insulating materials such as polysiloxane, silicon nitride, silicon oxide, and metal oxide including aluminum oxide.

The sensor unit 200 may be formed on a separate substrate (not shown) located on the encapsulation layer 330, or be directly formed on the encapsulation layer 330. The sensor unit 200 may include the touch sensor 10A, 10B, 10C, or 10D.

FIG. 9 is a view illustrating a display driving unit and pixels according to an exemplary embodiment.

For convenience of description, the display panel 300 and the pixels 320 are illustrated in FIG. 9, and other components (e.g., the substrate 310 and the encapsulation layer 330) of the display panel 300 are omitted.

Referring to FIG. 9, the pixels 320 may be connected to data lines D1 to Dq and scan lines S1 to Sp. For example, the pixels 320 may be arranged in a matrix form at intersection portions of the data lines D1 to Dq and the scan lines S1 to Sp.

Each of the pixels 320 may be supplied with a data signal and a scan signal through the data lines D1 to Dq and the scan lines S1 to Sp.

In addition, the pixels 320 may be connected to a first power source ELVDD and a second power source ELVSS.

Each of the pixels 320 may include a light emitting device (e.g., an organic light emitting diode), and generate light corresponding to current flowing from the first power source ELVDD to the second power source ELVSS via the light emitting device.

The display driving unit 400 may include a scan driver 410, a data driver 420, and a timing controller 450.

The scan driver 410 may supply scan signals to the scan lines Si to Sp in response to a scan driver control signal SCS. For example, the scan driver 410 may sequentially supply the scan signals to the scan lines S1 to Sp.

In order to connect the scan driver 410 to the scan lines S1 to Sp, the scan driver 410 may be directly mounted on the substrate 310 having the pixels 320 formed thereon, or be connected to the substrate 310 through a separate component such as a flexible circuit board.

The data driver 420 may generate a data signal by receiving a data driver control signal DCS and image data DATA, input from the timing controller 450.

The data driver 420 may supply the generated data signal to the data lines D1 to Dq.

In order to connect the data driver 420 to the data lines D1 to Dq, the data driver 420 may be directly mounted on the substrate 310 having the pixels 320 formed thereon, or be connected to the substrate 310 through a separated component such as a flexible circuit board.

If a scan signal is supplied to a specific scan line, some of the pixels 320 connected to the specific scan line may be supplied with a data signal transmitted from the data lines D1 to Dq, and some of the pixels 320 may emit light with a luminance corresponding to the supplied data signal.

The timing controller 450 may generate control signals for controlling the scan driver 410 and the data driver 420.

For example, the control signals may include the scan driver control signal SCS for controlling the scan driver 410 and the data driver control signal DCS for controlling the data driver 420.

In this case, the timing controller 450 may generate the scan driver control signal SCS and the data driver control signal DCS, using an external input signal.

For example, the external input signal may include a dot clock DCLK, a data enable signal DE, a vertical synchronization signal Vsync, and a horizontal synchronization signal Hsync.

In addition, the timing controller 450 may supply the scan driver control signal SCS to the scan driver 410, and supply the data driver control signal DCS to the data driver 420.

The timing controller 450 may convert image data RGB input from the outside into image data DATA suitable for specifications of the data driver 420, and supply the image data DATA to the data driver 420.

The data enable signal DE is a signal that defines a period in which effective data is input, and one period may be set to one horizontal period such as the horizontal synchronization signal Hsync.

In FIG. 9, it is illustrated that the scan driver 410, the data driver 420, and the timing controller 450 are individually provided, but at least some of the components may be integrated, if necessary.

In addition, the scan driver 410, the data driver 420, and the timing controller 450 may be installed in various ways including chip on glass, chip on plastic, tape carrier package, chip on film, and the like.

FIG. 10 is a sectional view of a display panel according to an exemplary embodiment.

Referring to FIG. 10, an organic light emitting diode OLED may include an anode electrode 730, an emitting layer 720, and a cathode electrode 710.

The emitting layer 720 may be disposed between the anode electrode 730 and the cathode electrode 710.

The emitting layer 720 may include an organic emission layer for self-luminescence. The emitting layer 720 may be formed in a structure in which a hole transporting layer, the organic emission layer, and an electron transporting layer are stacked. The emitting layer 720 may further include a hole injection layer and an electron injection layer.

According to the above-described structure, holes injected from the anode electrode 730 and electrons injected from the cathode electrode 710 are combined in the organic emission layer to form excitons, and light having a specific wavelength is generated from the emitting layer 720 by energy from the formed excitons.

The cathode electrode 710 may be connected to the second power source ELVSS.

The cathode electrode 710 may include a conductive material. For example, the cathode electrode 710 may include metals, any alloy thereof, a conductive polymer, a transparent conductive material, and the like.

In some embodiments, the cathode electrode 710 may include a material selected from the materials capable of constituting the driving electrodes Tx and the sensing electrodes Rx, which are described above.

A plurality of pixels 320 may be located on a substrate 310. In this case, the pixel 320 may be configured with a pixel circuit (not shown) including a driving transistor Tr and the organic light emitting diode OLED.

For convenience of description, only the driving transistor Tr directly related to the organic light emitting diode OLED is illustrated in FIG. 10. However, in order to control emission of the organic light emitting diode OLED, the pixel circuit (not shown) may be additionally provided with other transistors, capacitors, and the like, in addition to the driving transistor Tr.

The driving transistor Tr is formed on the substrate 310, and may be installed corresponding to each organic light emitting diode OLED.

The driving transistor Tr may include a gate electrode 610, a gate insulating layer 620, a semiconductor layer 630, and source/drain electrodes 640a and 640b.

The gate electrode 610 may be formed on the substrate 310.

The gate insulating layer 620 may be formed over the gate electrode 610. For example, the gate insulating layer 620 may be formed of an insulating material such as silicon oxide (SiOx) or silicon nitride (SiNx).

The semiconductor layer 630 may be formed on the gate insulating layer 620. For example, the semiconductor layer 630 may be formed of poly-silicon obtained by crystallizing amorphous silicon using laser, etc.

In addition, the semiconductor layer 630 may be formed of amorphous silicon, oxide semiconductor, or the like, in addition to the poly-silicon.

The source/drain electrodes 640a and 640b may be located at both sides of the semiconductor layer 630, respectively.

A protective layer 650 may be located over the driving transistor Tr, and include a contact hole 660 that exposes the source electrode 640a or the drain electrode 640b therethrough. In FIG. 10, a case where the drain electrode 640b is exposed by the contact hole 660 is illustrated as an example.

The gate electrode 610 and the source/drain electrodes 640a and 640b may be formed of a metal including molybdenum (Mo), tungsten (W), titanium (Ti), aluminum (Al), and the like, or any alloy or stack structure thereof. However, the exemplary embodiments are not limited thereto.

The anode electrode 730 may be formed on the protective layer 650. The anode electrode 730 may be connected to the source electrode 640a or the drain electrode 640b through the contact hole 660. In FIG. 10, a case where the anode electrode 730 is connected to the drain electrode 640b through the contact hole 660 is illustrated as an example.

For example, the protective layer 650 may be formed of an insulating material such as silicon oxide or silicon nitride.

A pixel defining layer 670 may be located on the protective layer 650. Also, the pixel defining layer 670 may expose at least a partial region of the anode electrode 730 therethrough.

For example, the pixel defining layer 670 may be made of one of an acryl-based organic compound and an organic insulating material such as polyamide or polyimide. However, the exemplary embodiments are not limited thereto, and the pixel defining layer 670 may be formed of various insulating materials.

An encapsulation layer 330 may be located over the organic light emitting diode OLED. Specifically, the encapsulation layer 330 may be located over the cathode electrode 710.

Also, the encapsulation layer 330 may be formed in a structure in which a plurality of layers are stacked. For example, the encapsulation layer 330 may include at least one organic layer 331 and at least one inorganic layer 332.

In FIG. 10, a case where the encapsulation layer 330 includes one organic layer 331 and one inorganic layer 332 is illustrated. However, the encapsulation layer 330 may include a plurality of organic layers 331 and a plurality of inorganic layers 332. In this case, the organic layers 331 and the inorganic layers 332 may be alternately stacked.

For example, the organic layer 331 may have a thickness of 8 μm or less. The organic layer 331 may have a thickness of 4 μm or less so as to increase the flexibility of the display panel 300.

In addition, the inorganic layer 332 may have a thickness smaller than that of the organic layer 331.

In addition, the sensor unit 200 of the touch sensor 10 may be located on the encapsulation layer 330.

In the touch sensor and the display device including the same according to the exemplary embodiments, driving signals are supplied to only some driving electrodes among a plurality of driving electrodes, or driving signals are simultaneously supplied to at least two driving electrodes among the plurality of driving electrodes, so that it is possible to decrease the number of channels required to supply driving signals. Thus, although the display area of the display device is increased, the number of channels required to drive the touch sensor can be decreased. Accordingly, a touch position can be efficiently detected.

Further, in the touch sensor and the display device including the same according to the exemplary embodiments, a touch position is detected using sensing signals received from some sensing electrodes among a plurality of sensing electrodes, or only a touch position on a specific touch sensing region is detected, so that it is possible to a calculation time required to detect a touch position. Accordingly, a touch position can be detected at fast speed.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the exemplary embodiments as set forth in the following claims.

What is claimed is:

1. A display device comprising:
   a display panel including a first surface on which an image is displayed and a second surface opposing the first surface; and
   a touch sensor,
   wherein the touch sensor comprises:
   a plurality of driving electrodes;
   a plurality of sensing electrodes; and
   a touch controller supplying driving signals to the plurality of driving electrodes,
   wherein, when an area of the display panel is not folded or curved, the touch controller simultaneously supplies driving signals to at least two driving electrodes among the plurality of driving electrodes, but less than all of the plurality of driving electrodes, wherein, as the area of the display panel is folded or curved, the touch controller sequentially supplies driving signals to the plurality of driving electrodes or simultaneously supplies the driving signals to at least two driving electrodes among the plurality of driving electrodes, but less than all of the plurality of driving electrodes, wherein the first surface includes a first region and a second region adjacent to the first region, and wherein, when the display device is folded or curved in a direction in which the first region and the second region face each other, the touch controller supplies the driving signals only to driving electrodes corresponding to either one of the first region or the second region.

2. The display device of claim 1, wherein, when the display device is folded or curved in a direction in which the first region and the second region face each other, the touch controller simultaneously supplies the driving signals to at least two adjacent driving electrodes among the plurality of driving electrodes corresponding to the first region.

3. The display device of claim 2, wherein the touch controller sequentially supplies the driving signals to the plurality of driving electrodes corresponding to the second region.

4. The display device of claim 1, wherein, when the display device is folded or curved in a direction in which a portion of the second surface faces the other portion of the second surface, the touch controller simultaneously supplies the driving signals to at least two adjacent driving electrodes among the plurality of driving electrodes corresponding to the portion of the second surface.

5. The display device of claim 4, wherein the touch controller sequentially supplies the driving signals to the plurality of driving electrodes corresponding to the other portion of the second surface.

6. The display device of claim 1, wherein, when the display device is folded or curved in a direction in which a portion of the second surface faces the other portion of the second surface, the touch controller supplies the driving signals only to the driving electrodes corresponding to either one of the portion of the second surface or the other portion of the second surface.

7. A display device comprising:
a display panel including a first surface on which an image is displayed and a second surface opposing the first surface; and
a touch sensor,
wherein the touch sensor comprises:
a plurality of driving electrodes;
a plurality of sensing electrodes, wherein the plurality of sensing electrodes includes preset reference sensing electrodes which are less in number than the plurality of sensing electrodes; and
a touch controller configured to detect a touch position, using sensing signals received from the plurality of sensing electrodes,
wherein, when an area of the display panel is not folded or curved, the touch controller detects the touch position, using sensing signals received from the preset reference sensing electrodes,
wherein, as the area of the display panel is folded or curved, the touch controller detects the touch position, using sensing signals sequentially received from the plurality of sensing electrodes, or detects the touch position, using sensing signals received from the preset reference sensing electrodes, wherein the first surface includes a first region and a second region adjacent to the first region, and wherein, when the display device is folded or curved in a direction in which the first region and the second region face each other, the touch controller detects the touch position, using only sensing signals received from sensing electrodes corresponding to either one of the first region or the second region.

8. The display device of claim 7, wherein, when the display device is folded or curved in a direction in which the first region and the second region face each other, the touch controller detects the touch position, using sensing signals received from the preset reference sensing electrodes corresponding to the first region.

9. The display device of claim 8, wherein the touch controller detects the touch position, using sensing signals sequentially received from sensing electrodes corresponding to the second region among the plurality of sensing electrodes.

10. The display device of claim 7, wherein, when the display device is folded or curved in a direction in which a portion of the second surface faces the other portion of the second surface, the touch controller detects the touch position, using sensing signals received from the preset reference sensing electrodes corresponding to the portion of the second surface.

11. The display device of claim 10, wherein the touch controller detects the touch position, using sensing signals sequentially received from sensing electrodes corresponding to the other portion of the second surface among the plurality of sensing electrodes.

12. The display device of claim 7, wherein, when the display device is folded or curved in a direction in which a portion of the second surface faces the other portion of the second surface, the touch controller detects the touch position, using only the sensing signals received from sensing electrodes corresponding to either one of the portion of the second surface or the other portion of the second surface.

13. A touch sensor comprising:
a plurality of driving electrodes disposed on a first surface;
a plurality of sensing electrodes disposed on the first surface; and
a touch controller,
wherein, when an area of the plurality of driving electrodes or the plurality of sending electrodes are not curved, the touch controller simultaneously supplies driving signals to at least two driving electrodes among the plurality of driving electrodes,
wherein, as the area of the plurality of driving electrodes or the plurality of sensing electrodes are curved, the touch controller sequentially supplies driving signals to the plurality of driving electrodes or simultaneously supplies driving signals to at least two adjacent driving electrodes among the plurality of driving electrodes, but less than all of the plurality of driving electrodes,
wherein the first surface includes a first region and a second region adjacent to the first region, and
wherein, when the touch sensor is folded or curved in a direction in which the first region and the second region face each other, the touch controller detects the touch position, using only sensing signals received from sensing electrodes corresponding to either one of the first region or the second region.

14. The touch sensor of claim 13, wherein, as the plurality of driving electrodes or the plurality of sensing electrodes are curved, the touch controller detects a touch position, using sensing signals sequentially received from the plurality of sensing electrodes, or detects the touch position, using sensing signals received from preset reference sensing electrodes among the plurality of sensing electrodes.

15. The touch sensor of claim 13, wherein a number of the plurality of driving electrodes is greater than that of the plurality of sensing electrodes.

16. The touch sensor of claim 13, wherein a number of the plurality of sensing electrodes is greater than that of the plurality of driving electrodes.

17. The display device of claim 1, wherein, when the area of the display panel is not folded or curved, the touch controller simultaneously supplies the driving signals to at least two driving electrodes disposed in the first region and the second region and directly adjacent to each other.

* * * * *